United States Patent
Fürst et al.

(10) Patent No.: US 11,142,451 B2
(45) Date of Patent: Oct. 12, 2021

(54) RAMPING OF SENSOR POWER IN A MICROELECTROMECHANICAL SYSTEM DEVICE

(71) Applicant: KNOWLES ELECTRONICS, LLC, Itasca, IL (US)

(72) Inventors: Claus Fürst, Roskilde (DK); Venkataraman Chandrasekaran, Itasca, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 43 days.

(21) Appl. No.: 16/466,606

(22) PCT Filed: Nov. 30, 2017

(86) PCT No.: PCT/US2017/064036
§ 371 (c)(1),
(2) Date: Jun. 4, 2019

(87) PCT Pub. No.: WO2018/106513
PCT Pub. Date: Jun. 14, 2018

(65) Prior Publication Data
US 2019/0345026 A1    Nov. 14, 2019

Related U.S. Application Data

(60) Provisional application No. 62/430,092, filed on Dec. 5, 2016.

(51) Int. Cl.
*G01L 19/04* (2006.01)
*H04R 19/00* (2006.01)
(Continued)

(52) U.S. Cl.
CPC ............ *B81B 7/008* (2013.01); *G01L 9/0042* (2013.01); *G01L 19/04* (2013.01); *H04R 19/005* (2013.01);
(Continued)

(58) Field of Classification Search
CPC ............ B81B 7/008; B81B 2201/0257; G01L 9/0042; G01L 19/04; G01L 19/143;
(Continued)

(56) References Cited

U.S. PATENT DOCUMENTS

| | | | |
|---|---|---|---|
| 6,091,229 A * | 7/2000 | Oglesbee | H02J 7/022 320/137 |
| 7,190,038 B2 | 3/2007 | Dehe et al. | |

(Continued)

OTHER PUBLICATIONS

International Search Report and Written Opinion, PCT/US2017/064036, Knowles Electronics, LLC (dated Feb. 15, 2018).

*Primary Examiner* — Oyesola C Ojo
(74) *Attorney, Agent, or Firm* — Foley & Lardner LLP (57) ABSTRACT

A microelectromechanical system (MEMS) device includes at least one substrate, a lid, a MEMS component, a sensor, and a power supply. The lid is coupled to the substrate so that the substrate and the lid cooperatively define an interior cavity. The MEMS component is disposed within the interior cavity. The sensor is disposed within the interior cavity and is arranged to detect a parameter of the interior cavity. The power supply provides current to the sensor. The power supply is configured to control current during a ramp-up transition of the current and a ramp-down transition of the current such that the ramp-up transition and the ramp-down transition have attenuated high-frequency components.

20 Claims, 6 Drawing Sheets

(51) Int. Cl.
  *H04R 19/04* (2006.01)
  *B81B 7/00* (2006.01)
  *G01L 9/00* (2006.01)
(52) U.S. Cl.
  CPC ...... *B81B 2201/0257* (2013.01); *H04R 19/04* (2013.01); *H04R 2410/03* (2013.01)
(58) Field of Classification Search
  CPC .. H04R 19/005; H04R 19/04; H04R 2410/03; H04R 3/00; H02M 1/36; H02M 1/44
  See application file for complete search history.

(56) References Cited

U.S. PATENT DOCUMENTS

| | | | |
|---|---|---|---|
| 7,473,572 B2 | 1/2009 | Dehe et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 8,803,622 B1 * | 8/2014 | Yan | H03B 5/36 331/116 M |
| 2005/0207605 A1 * | 9/2005 | Dehe | H04R 19/04 381/369 |
| 2007/0278501 A1 | 12/2007 | Macpherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |
| 2010/0046780 A1 | 2/2010 | Song | |
| 2010/0052082 A1 | 3/2010 | Lee et al. | |
| 2010/0128914 A1 | 5/2010 | Khenkin | |
| 2010/0183181 A1 | 7/2010 | Wang | |
| 2010/0246877 A1 | 9/2010 | Wang et al. | |
| 2010/0290644 A1 | 11/2010 | Wu et al. | |
| 2010/0322443 A1 | 12/2010 | Wu et al. | |
| 2010/0322451 A1 | 12/2010 | Wu et al. | |
| 2011/0013787 A1 | 1/2011 | Chang | |
| 2011/0075875 A1 | 3/2011 | Wu et al. | |
| 2012/0175230 A1 * | 7/2012 | Hammond | H01H 59/0009 200/181 |
| 2016/0100257 A1 | 4/2016 | Nielsen et al. | |
| 2016/0221822 A1 * | 8/2016 | Krumbein | H04R 19/005 |
| 2016/0349056 A1 * | 12/2016 | Thompson | B81B 3/0018 |
| 2018/0034376 A1 * | 2/2018 | Cattani | H02M 3/33515 |
| 2018/0125743 A1 * | 5/2018 | Aarestad | A61H 9/0057 |

* cited by examiner

RAMPING OF SENSOR POWER IN A MICROELECTROMECHANICAL SYSTEM DEVICE

CROSS-REFERENCE TO RELATED APPLICATIONS

This application claims the benefit of and priority to U.S. Provisional Application No. 62/430,092, filed Dec. 5, 2016, the entire contents of which are incorporated herein by reference.

BACKGROUND

The following description is provided to assist the understanding of the reader. None of the information provided is admitted to be prior art.

Compact components are desirable when building high-performance, high-density devices such as cell phones, digital still cameras, portable music players, and other portable electronic devices. However, as components become more compact and devices become increasingly high-density, interactions between the components can impact performance of the components or the device. One solution for providing high quality, compact devices is to use microelectromechanical systems (MEMS).

SUMMARY

In an aspect, a MEMS device includes a MEMS element, a sensor for detecting a parameter, and a power supply providing current to the sensor. In embodiments, the power supply is arranged to control current during a ramp-up transition of the current and a ramp-down transition of the current, the control of the current during the ramp-up transition and the ramp-down transition attenuating high-frequency components of the provided current. In various embodiments, the parameter is temperature, humidity, pressure, presence of a gas, or concentration of a gas. In some embodiments, the MEMS element comprises an acoustic device. In these and other embodiments, the attenuation of the high-frequency components reduces one or both of thermal noise effects and electrical noise effects on acoustic information provided from the acoustic device.

In an aspect, a method of providing power from a power supply to a sensor positioned within a MEMS device includes providing current from the power supply to the sensor according to a ramp-up profile, wherein the current from the power supply is controlled such that the ramp-up profile has attenuated high-frequency components, and providing current from the power supply to the sensor according to a ramp-down profile, wherein the current from the power supply is controlled such that the ramp-down profile has attenuated high-frequency components. In some embodiments, one or both of the ramp-up profile and the ramp-down profile are non-linear. In these and other embodiments, one or both of the ramp-up profile and the ramp-down profile have a logarithmic or exponential curvature. In some embodiments, the attenuation of the high-frequency components reduces thermal noise effects and electrical noise effects on acoustic information provided from an acoustic device of the MEMS device.

The foregoing summary is illustrative and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more apparent from the following description, claims, and drawings.

In the following detailed description, reference is made to the accompanying drawings, which form a part hereof. In the drawings, similar symbols typically identify similar components. The illustrative embodiments described in the detailed description, drawings, and claims are not meant to be limiting. Other embodiments may be used, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are within the scope of the present disclosure.

DETAILED DESCRIPTION

According to one or more embodiments, a MEMS device (e.g., for a smartphone, a tablet, a laptop, a smart watch, a hearing aid, a video camera, a communications device, etc.) includes a substrate (e.g., a base, a PCB, etc.), an acoustic device (e.g., a microphone component or transducer, such as a MEMS element), circuitry, and a lid. In some embodiments, the MEMS device may further include one or more sensors, such as temperature, humidity, pressure, gas or other sensors. The additional sensor(s) may generate heat, which heats air within the MEMS device. Additionally, or alternatively, as the sensor is used, materials (e.g., silicon) of the sensor may heat and contract, and/or bonding wires may vibrate. The heated air, expansion and contraction, and/or vibrating bonding wires may change a response of the acoustic device, which may introduce acoustic noise into an acoustic output or input of the acoustic device.

Power provided to a sensor in a MEMS device may be intermittent, such as a pulse train provided to maintain a capacitive charge in a desired voltage range, or such as an application of power to switch on the sensor for a time sufficient to perform sensing followed by removal of power to switch off the sensor until a next time when sensing is desired (e.g., to conserve energy or to extend life of the sensor). For example, a duration of a single on state may lie between 50 milliseconds (ms) and 200 ms. Each time that power is applied, a rapid increase in voltage (e.g., from zero Volts (V) to 2.5 V) causes a corresponding rapid increase in current, which may include current spikes or initial oscillation of the current. The rapid increase in current causes heating of the sensor (and potentially heating of traces or wires of the substrate), which in turn causes heating of air surrounding the sensor. The heat energy is conducted throughout the air in the MEMS device, and reaches the acoustic device. As the power to the sensor is turned on and off, the air in the MEMS device experiences heating and cooling cycles, which can lead to corresponding pressure changes in the MEMS device, which pressure changes may be indistinguishable from acoustic information to the acoustic device. As the power to the sensor is turned on and off, the thermal cycles may cause thermal noise effects to be added to actual acoustic information, which can cause inaccurate interpretation of the acoustic information, and may be propagated to a speaker as buzzing, popping or other noise.

A solution to thermal noise effects includes gradually ramping-up and ramping-down a supply current provided to the sensor at each on state and off state. For example, rather than providing the supply current in a square waveform, embodiments described herein use a modified supply current waveform for one or more sensors in which the off-to-on and/or on-to-off transitions are ramped in a manner to avoid transitions which can cause spikes and ringing. In addition to reducing thermal noise effects, elimination of sharp corners in the modified supply current waveform also attenuates higher-frequency components of the supply current waveform and therefore attenuates electrical noise caused by the power being turned on and off, thereby reducing electrical noise effects in the acoustic information.

Figure 1:
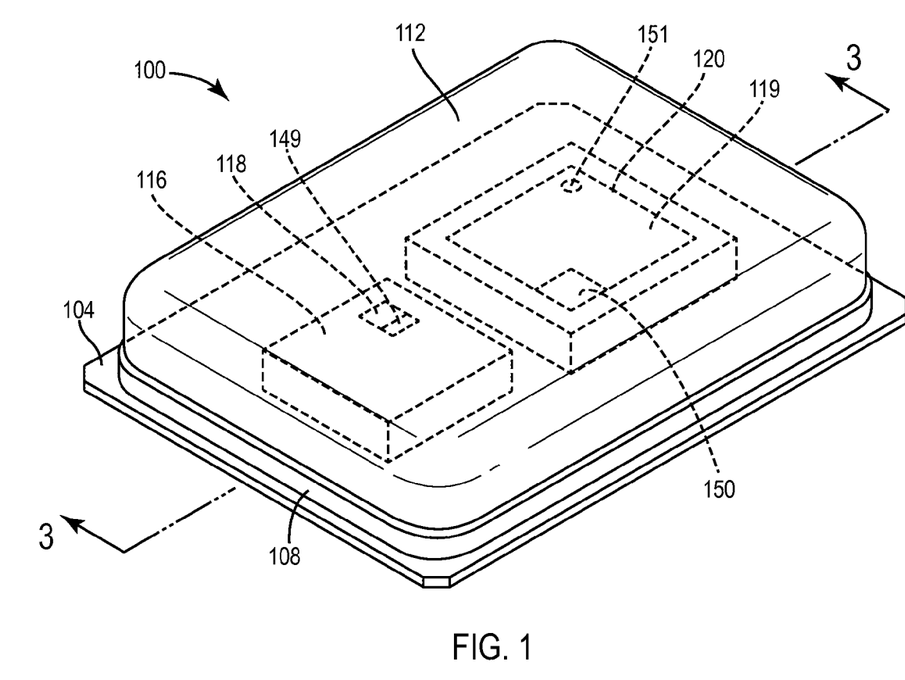
FIG. 1 is a perspective view of a MEMS device according to one embodiment.
Figure 2:
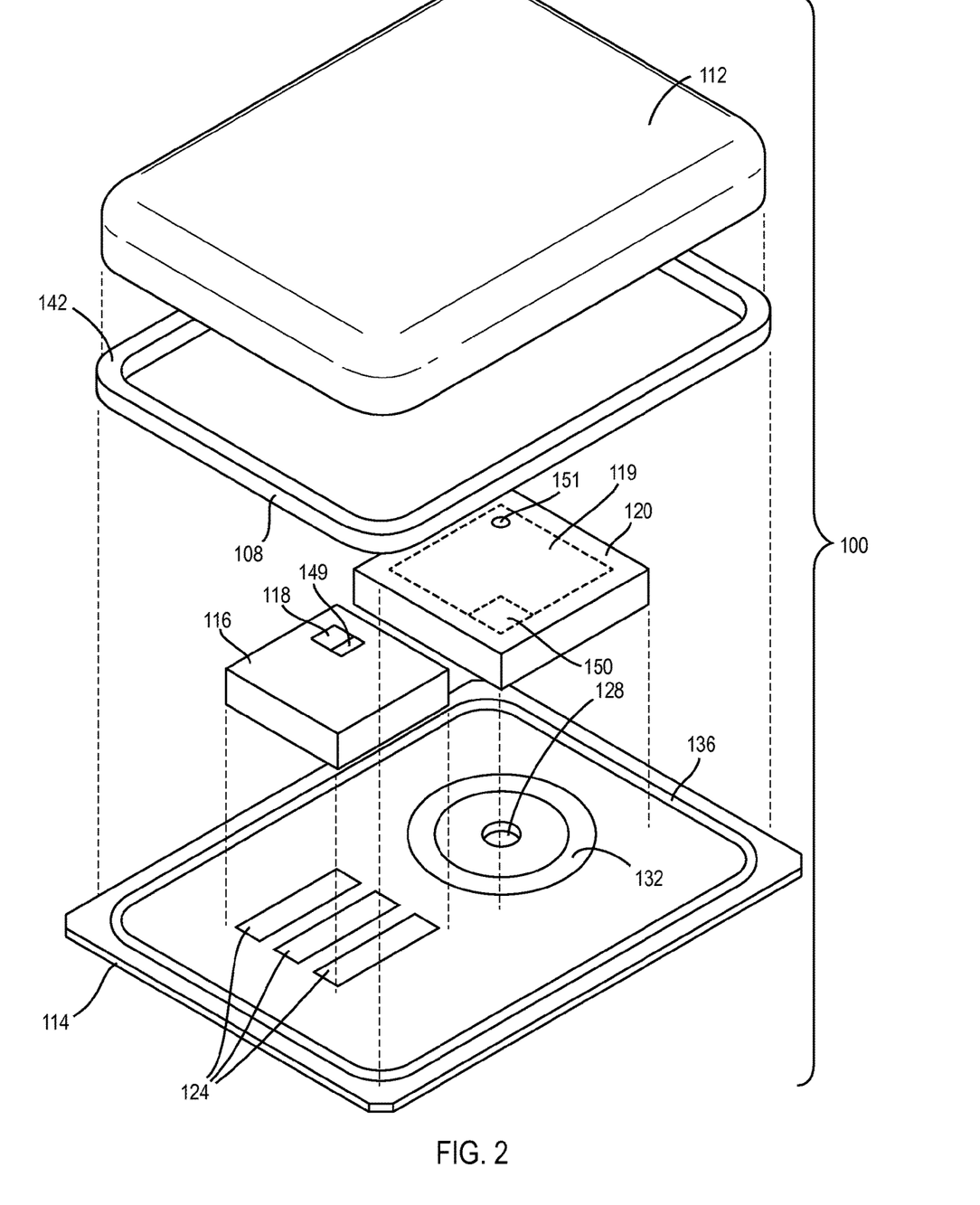
FIG. 2 is an exploded view of the MEMS device of FIG. 1.
Figure 3:
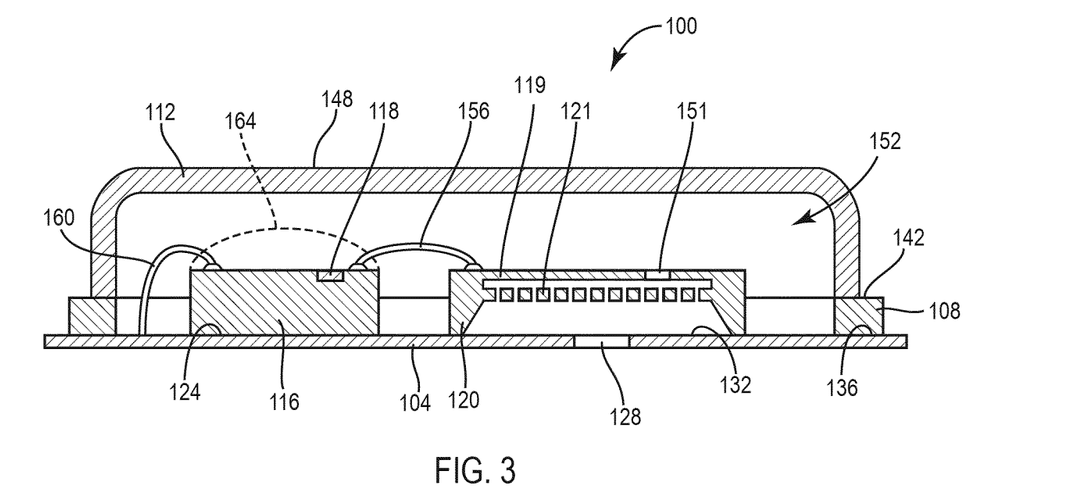
FIG. 3 is a cross-sectional view of the MEMS device of FIG. 1 taken along the line 3-3.

FIGS. 1-3 illustrate different views of a MEMS device 100 according to embodiments of the present disclosure. FIG. 1 is a perspective view of the MEMS device 100, FIG. 2 is an exploded view of FIG. 1, and FIG. 3 is a side cross-sectional view of the MEMS device 100.

According to the embodiment shown in FIGS. 1-3, the MEMS device 100 includes a substrate 104, a guard ring 108 (e.g., a boundary portion), a lid 112 (e.g., a cap, can, or other cover), a processor circuit 116 (e.g., circuitry in the form of a processor, an integrated circuit (IC), an application-specific IC (ASIC), discrete circuitry, or a combination thereof), one or more sensors 118 (e.g., a temperature sensor, a humidity sensor, a chemical/gas sensor, a pressure sensor, other sensor, or a combination thereof), a MEMS element 120 (e.g., a MEMS motor, a MEMS microphone, an accelerometer, a gyroscope, or other MEMS component, or a combination thereof).

The substrate 104 is illustrated as a single substrate 104, but instead may be multiple substrates 104. In some embodiments, the substrate 104 includes one or more dielectric layers, one or more metal layers, and/or one or more layers of material forming the substrate (e.g., a printed circuit board manufactured from FR-4 material, or a semiconductor substrate). In one or more embodiments, the substrate 104 includes conductive traces surrounded by and/or embedded in non-conductive substrate material. In FIG. 2, the substrate 104 includes one or more circuit traces 124 and one or more pads (not illustrated), over which the processor circuit 116 is disposed. In one or more embodiments, the substrate 104 further includes one or more apertures, such as a port 128 that extends through the substrate 104 and provides fluid (e.g., air) communication therethrough. In one or more embodiments, the substrate 104 includes a component mount 132, which is substantially annular and surrounds the port 128. In one or more embodiments, the substrate 104 includes a guard ring mount 136. The substrate 104 may include other features, traces or pads, and/or may include embedded components.

In some embodiments, the circuit traces 124 are configured to receive flux and/or solder (e.g., a remeltable conductive metal alloy, lead free solder, etc.) to electrically couple the processor circuit 116 to the substrate 104. In other embodiments, the circuit traces 124 include depressions or locations on the substrate 104 configured to receive adhesive and/or another coupling mechanism. The layout and/or configuration of the circuit traces 124 may be arranged to suit the particular processor circuit 116, substrate 104, and component configuration employed in the MEMS device 100.

Generally, traces such as the circuit traces 124 and other connections in the substrate 104 (e.g., vias, redistribution layers, metal layers, and so forth) provide connections between components disposed on the substrate 104, such as the processor circuit 116 and the MEMS element 120, and/or connections between components disposed on the substrate 104 and components external to the MEMS device 100.

As shown in FIG. 3, in one or more embodiments, the MEMS element 120 can be additionally or alternatively electrically coupled to the processor circuit 116 such as with one or more wire bonds 156, and the processor circuit 116 can be additionally or alternatively electrically coupled to the substrate 104 with one or more wire bonds 160. The wire bonds 156, 160 can provide communication between ones of the processor circuit 116, the sensor 118, the MEMS element 120 and a power supply 149. Other connections may also be made.

As shown in FIG. 2, the port 128 is a substantially round through-hole defined by (e.g., formed through, etc.) the substrate 104. The port 128 may facilitate communication (e.g., audible communication) between the MEMS element 120 and an ambient environment (e.g., the acoustic sensor 119 receives or delivers sound energy through the port 128). According to the embodiment shown in FIG. 2, the MEMS device 100 is a bottom-port MEMS device 100 (e.g., the substrate 104 defines the port 128). In other embodiments, the port 128 has a different shape, has a different diameter, and/or is positioned differently on the substrate 104. In an alternative embodiment, the MEMS device 100 is a top-port MEMS device (e.g., the lid 112 defines the port 128).

According to an embodiment, the component mount 132 is configured (e.g., arranged, positioned, shaped, and so forth) to couple to the MEMS element 120, such that the MEMS element 120 is mechanically and/or electrically coupled to the substrate 104. In some embodiments, the component mount 132 is configured to receive flux and/or solder. In other embodiments, the component mount 132 is configured to receive adhesive and/or another coupling mechanism. The layout and/or configuration of the component mount 132 may be arranged to suit the particular MEMS element 120 and substrate 104 employed in the MEMS device 100. By way of example, the component mount 132 may have a different shape and/or a different diameter than shown. In other embodiments, the substrate 104 does not include the component mount 132.

As shown in FIG. 2, the guard ring mount 136 substantially surrounds the circuit traces 124, the port 128, and the component mount 132 (e.g., the guard ring mount 136 extends along around at least a portion of the periphery of the substrate 104). The guard ring mount 136 is configured (e.g., arranged, positioned, shaped, and so forth) for coupling to the guard ring 108, such that the guard ring 108 may be mechanically and/or electrically coupled to the substrate 104 through the guard ring mount 136. In some embodiments, the guard ring mount 136 is sunken in or recessed relative to a surface of the substrate 104. In some embodiments, the guard ring mount 136 is configured to receive flux and/or solder. In other embodiments, the guard ring mount 136 is configured to receive adhesive and/or another coupling mechanism. The layout and/or configuration of the guard ring mount 136 may be arranged to suit the particular guard ring 108 and substrate 104 or other component employed in the MEMS device 100. By way of example, the guard ring mount 136 may have a different shape and/or surround or encompass a different section or portion of the substrate 104. In other embodiments, the substrate 104 does not include the guard ring mount 136.

As shown in FIG. 2, the guard ring 108 is configured to couple to the guard ring mount 136 such that the guard ring 108 is positioned to extend around the periphery of the substrate 104. In other embodiments, the MEMS device 100 does not include the guard ring 108. The guard ring 108 may be formed of (e.g., manufactured from) a metal material (e.g., a ferrous metal, a non-ferrous metal, copper, steel, iron, silver, gold, aluminum, titanium, other metal, or a combination thereof) or other material (e.g., a plastic material, a thermoplastic material, a ceramic material, other material, or a combination thereof). As shown in FIG. 2, the guard ring 108 includes a first coupling surface 142 that mechanically couples to the lid 112. The guard ring 108 may further electrically couple to the lid 112. In an embodiment, the first coupling surface 142 of the guard ring 108 includes a trace and/or is tinned such that the lid 112 may be soldered to the first coupling surface 142. In other embodiments, the first coupling surface 142 is configured to receive adhesive and/or another coupling mechanism in order to couple the lid 112 thereto. In another embodiment, the guard ring 108 is formed as a part of the substrate 104 and/or is embedded in the substrate 104. By way of example, the guard ring 108 may be a portion of the substrate 104 that extends upward from the substrate 104 and is configured to engage the lid 112. In still other embodiments, the guard ring 108 is formed as a part of the lid 112. For example, the guard ring 108 may be a flange that extends from the lid 112 and is arranged to couple to the substrate 104. In still other embodiments, the guard ring 108 may be eliminated and the lid 112 coupled directly to the substrate 104.

The lid 112 may be manufactured from a metal material (e.g., a ferrous material, a non-ferrous material, aluminum, titanium, steel, other metal, or a combination thereof) or another material (e.g., a plastic, a thermoplastic, a ceramic, other material, or a combination thereof). The lid 112 is configured to couple to the first coupling surface 142 of the guard ring 108 (e.g., with solder or an adhesive).

According to an embodiment, the processor circuit 116 is arranged in electrical communication with the sensor 118 and the MEMS element 120. The processor circuit 116 may be configured to modify signals produced by the sensor 118 and the MEMS element 120 (or other component in the MEMS device 100), and communicate them to an external device through a serial and/or parallel interface.

The processor circuit 116 may include the sensor 118 and may include the power supply 149. In some embodiments, the sensor 118 is separate from, and powered by, the processor circuit 116 or other component (e.g., an ASIC).

The power supply 149 alternatively may be formed as a part of the sensor 118, may be a separate component, may be formed as a part of another power supply arranged to provide power to one or more components of the MEMS device 100, or may be a control circuit or switch arranged to regulate communication of power to the sensor 118. For the purposes of this disclosure, the power supply 149 will refer to a component which affects or regulates a delivery of power to the sensor 118. The illustrated sensor 118 is mounted to the processor circuit 116. In other embodiments, the sensor 118 may be mounted elsewhere in the MEMS device 100. For example, the sensor 118 can be mounted to the substrate 104, the lid 112, or to another component in the MEMS device 100.

The MEMS element 120 includes a MEMS transducer 119 and defines a vent hole 151. Although not shown in detail, the MEMS transducer 119 may include a diaphragm and a backplate. The MEMS element 120 may be configured to communicate an electrical signal to the processor circuit 116 representing a received acoustic signal (pressure changes), or to receive an electrical signal from the processor circuit 116 and generate an acoustic signal.

As shown in FIG. 3, the substrate 104, the guard ring 108, and the lid 112 cooperatively define a geometric back volume, shown as interior cavity 152. In the illustrated embodiment, the vent hole 151 is in communication with the interior cavity 152 to thereby provide barometric relief for MEMS element 120. However, vent hole 151 is not necessary in all embodiments. Coupling the MEMS element 120 to the component mount 132 may provide a seal or an acoustic seal between the MEMS element 120 and the substrate 104 such that the port 128 is isolated and/or sealed relative to the interior cavity 152.

In one or more embodiments, an optional encapsulant may be disposed over portions of the substrate 104 and/or over at least portions of one or more of the components disposed on the substrate 104. For example, an encapsulant 164 is illustrated in FIG. 3 over a top surface of the processor circuit 116 to protect the wire bonds 156, 160. Other portions of the MEMS device 100 may alternatively or additionally be encapsulated. An encapsulant may include, for example, an epoxy, a polyimide, or a thermoplastic.

In some embodiments, the MEMS device 100 is assembled by applying flux and/or paste solder or a combined fluxing/soldering product to the circuit traces 124, the component mount 132, the guard ring mount 136, and the first coupling surface 142 of the guard ring 108 and disposing the various components in their respective positions. The MEMS device 100 may then be heat cycled to flow the solder and couple the components together. In other embodiments, adhesives or other coupling mechanisms are employed.

Figure 4A:
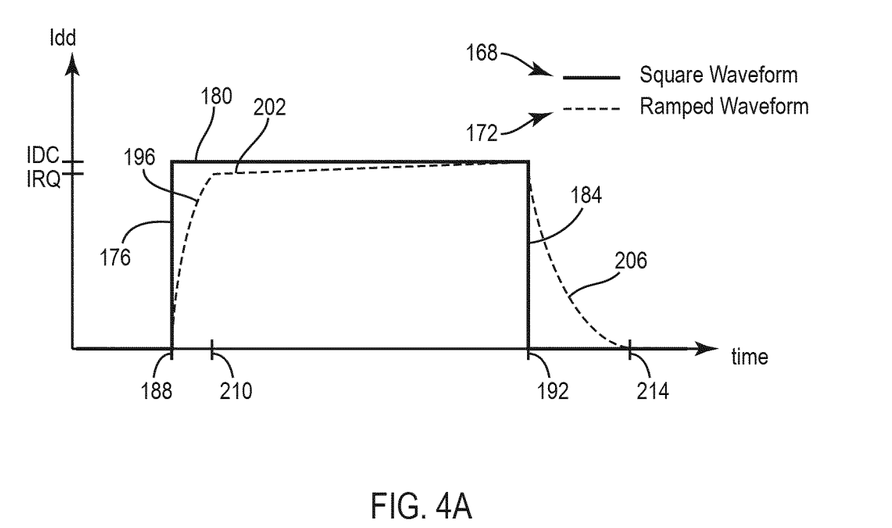
FIG. 4A is a graph of current versus time showing a ramped profile that may be used by the MEMS device in the embodiment of FIG. 1 or other embodiments.

FIG. 4A illustrates a graph of current (Idd) supplied from a power supply (e.g., the power supply 149) to a sensor (e.g., the sensor 118) over time. The solid line represents a square waveform which, as described above, can introduce thermal noise effects that detrimentally affect a performance of the MEMS device 100. The broken line represents a modified waveform 172 that is provided to the sensor to reduce the thermal noise effects.

As shown in FIG. 4A, the square waveform 168 includes a fast transition ramp-up portion 176, a substantially steady (flat) power portion 180, and a fast transition ramp-down portion 184. The ramp-up portion 176 and the ramp-down portion 184 provide/remove power to the sensor quickly (for quick on/off times, respectively), and the power portion 180 provides a substantially constant current Idd=IDC to the sensor during an on time of the sensor. The square waveform 168 defines a duration between a first time 188 and a second time 192. In one embodiment, the duration is between about 50 ms and about 200 ms. In this and other embodiments, the duration is selected such that harmonics of a frequency associated with the duration are outside the audible range. Not illustrated in FIG. 4A are current spikes and ringing that are associated with fast current transitions.

As also shown in FIG. 4A, the modified waveform 172 includes a ramp-up portion 196, a power portion 202, and a ramp-down portion 206. The ramp-up portion 196 has a longer duration (slower transition) than the ramp-up portion 176 of the square waveform 168, and the ramp-down portion 206 has a longer duration (slower transition) than the ramp-down portion 184 of the square waveform 168. In the embodiment illustrated, the ramp-up portion 196 smoothly increases to a current IRQ at a time 210, after which the current increases slowly to approximately the current IDC. In the embodiment illustrated, the ramp-down portion 206 smoothly decreases from approximately the current IDC at the second time 192, to a current level representing an off state of the sensor (e.g., substantially zero current) at a third time 214.

In other embodiments, the ramp-up portion 196 may define a different shape, such as a linear ramp, a stepped ramp, a logarithmic curvature, an exponential curvature, or a bell-shaped (e.g., Gaussian) curvature to the current IRQ. Additionally, the transition between the ramp-up portion 196 and the power portion 202 may define a different shape or profile. For example, the ramp-up portion 196 and the power portion 202 may both follow a same exponential function to reach approximately the current IDC. The duration of the ramp-up portion 196 (e.g., between the first time 188 and the time 210) may be longer or shorter in relation to the power portion 202 and the ramp-down portion 206.

In other embodiments, the ramp-down portion 206 may define a different output shape or profile, such as a linear ramp or a stepped ramp from the current IDC to the current level representing the off state. Additionally, the duration of the ramp-down portion 206 (e.g., between the second time 192 and the third time 214) may be longer or shorter in relation to the power portion 202 and the ramp-up portion 196. In other embodiments, the transition between the power portion 202 and the ramp-down portion 206 may define a different shape or profile.

By extending transition times of a waveform (e.g., extending the transition time of the ramp-up portion 176 of the square waveform 168 to the longer duration transition time of the ramp-up portion 196 of the ramped waveform 172, and/or extending the transition time of the ramp-down portion 184 of the square waveform 168 to the longer duration transition time of the ramp-down portion 206 of the ramped waveform 172), higher-frequency components of the transitions are attenuated, and therefore electrical noise produced by cycling between on states and off states of sensors is attenuated as well.

Figure 4B:
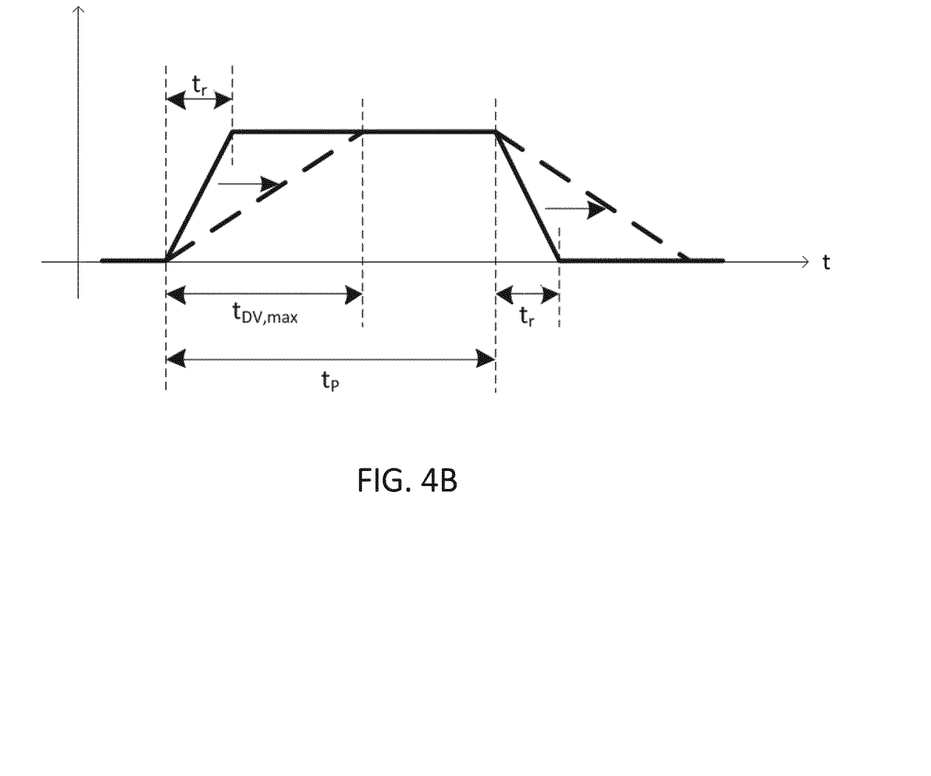
FIG. 4B plots a square waveform current pulse.
Figure 4C:
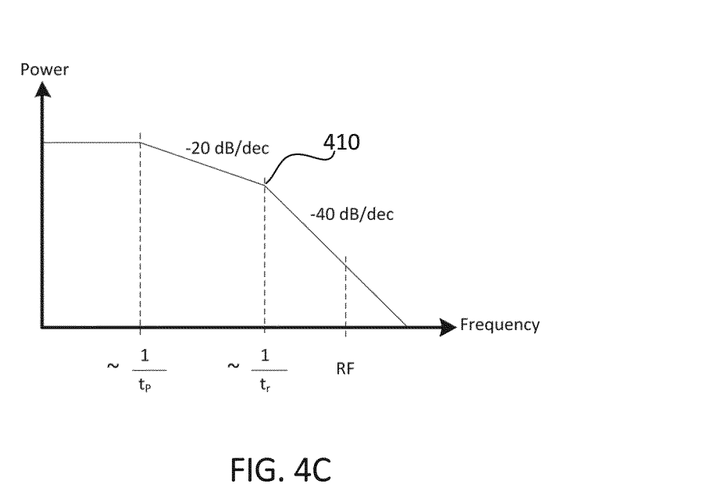
FIG. 4C plots a power spectrum of a square waveform current pulse.

FIGS. 4B and 4C provide further illustration of benefits of extending transition times.

FIG. 4B plots current (I) versus time (t) for a square waveform current pulse having a pulse width $t_p$. Two options for transition times are shown in FIG. 4B, one in solid line and one in dotted line. The transition time for the solid line is $t_r$, and the transition time for the dotted line is $t_{DV,max}$. As the transition time increases from $t_r$ to $t_{DV,max}$, high frequency components of the pulse current reduce, and thus total power applied to the sensor is reduced.

FIG. 4C is a plot of a power spectrum representing a square wave current pulse. For frequencies up to about $f=1/t_p$, power levels are approximately consistent. There is a 20 decibel per decade (dB/dec) drop in power for frequencies between about $f=1/t_p$ and about $f=1/t_r$. At about $f=1/t_r$, there is a corner frequency 410, and for frequencies above about $f=1/t_r$, there is a 40 dB/dec drop in power. As can be seen from FIG. 4C, as the value of $1/t_r$ is reduced, the corner frequency 410 shifts left on the graph, and the 40 dB/dec drop in power applies to a wider range of frequencies. Accordingly, as $t_r$ is increased, more of the higher frequencies are attenuated and total power is reduced. In one or more embodiments, $t_r$ is greater than or equal to about 10 milliseconds (ms). In one or more embodiments, $t_p$ is greater than or equal to about 10 ms.

Figure 5:
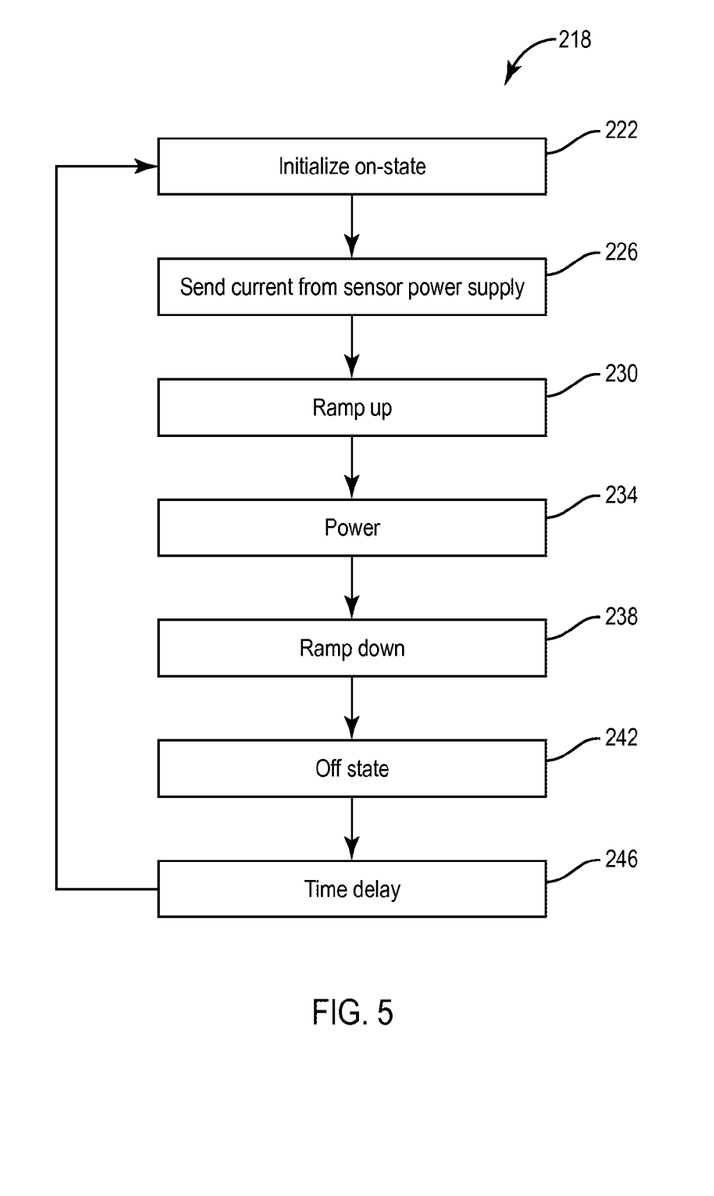
FIG. 5 is a flow chart representing a method of operating the MEMS device in the embodiment of FIG. 1 or other embodiments.

FIG. 5 shows a method 218 of providing power from to a sensor within the MEMS device 100. In one embodiment, the sensor is the sensor 118 and the sensor power supply is the power supply 149.

At 222, the processor circuit 116 initializes the on-state of the sensor by controlling a sensor power supply to begin providing power to the sensor. Current is provided from the sensor power supply to the sensor at 226 (e.g., at the first time 188 in FIG. 4A). The sensor power supply then provides current at 230 according to a ramp-up profile (e.g., the ramp-up portion 196 between the first time 188 and the ramp-up time 210 in FIG. 4A). The ramp-up profile gradually increases the current to a ramp-up current (e.g., the ramp-up current IRQ in FIG. 4A) and then power is provided to the sensor at 234 (e.g., the power portion 202 in FIG. 4A) until the sensor is to be turned off (e.g., at the second time 192 in FIG. 4A). Then, at 238, the sensor power supply provides current to the sensor according to a ramp-down profile (e.g., the ramp-down portion 206 in FIG. 4A). The ramp-down profile continues until an off state of the power is achieved at 242 (e.g., at the third time 214 in FIG. 4A). After the off state is achieved, a time delay is introduced at 246 and lasts for a predetermined time. The predetermined time will depend on a type of the sensor and a desired sampling rate. After the time delay at step 246, the on state is initialized again at step 222 and the method 218 repeats.

Figure 6A:
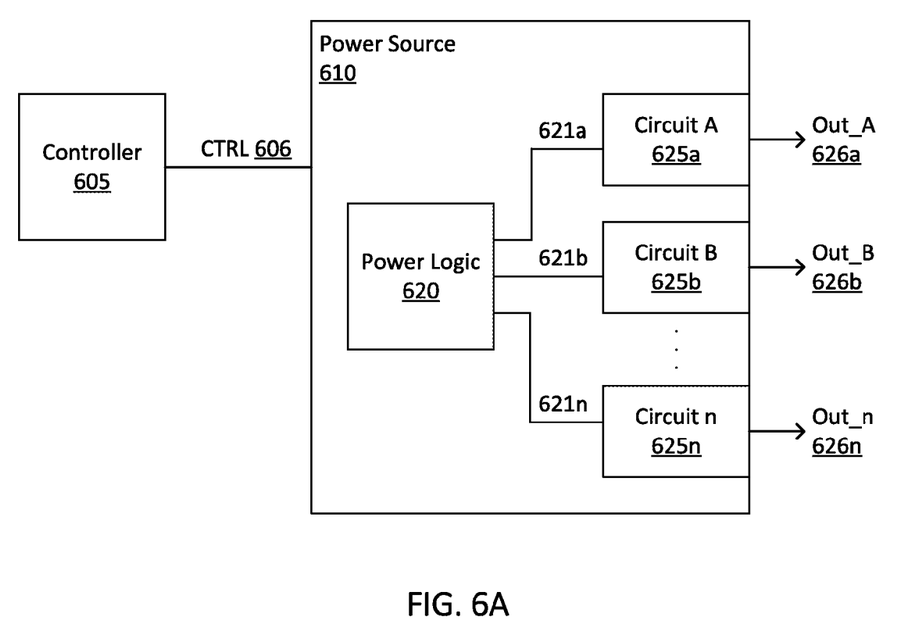
FIG. 6A illustrates an example of a system for controlling transition times of a current pulse according to one embodiment.

FIG. 6A illustrates an example of a system for controlling transition times of a current pulse according to one embodiment. A controller 605 provides one or more control signals 606 to a power source 610. Power logic 620 in the power source 610 interprets the control signal 606, and provides signals over signal paths 621*a*, 621*b*, 621*n* to respective circuits 625*a*, 625*b*, 625*n*, which provide respective outputs 626*a*, 626*b*, 626*n*. The controller 605 may be, for example, the processor circuit 116. The power source may be, for example, the power supply 149. In some embodiments, the controller 605 and the power source 610 are implemented together in a single component, such as an ASIC. In other embodiments, the controller 605 and the power source 610 are implemented as separate components.

The power logic 620 may include digital or analog circuitry or a combination of digital and analog circuitry, and may further include in some embodiments circuitry that executes instructions from firmware or software to perform one or more of the functions described.

The control signal 606 can include a command provided through a serial or parallel interface, or levels or edges of a signal on a control line (e.g., wire or circuit trace). The control signal 606 may be provided, for example, to initiate or terminate a pulse, initiate a pulse of a given duration, initiate a pulse train with given pulse widths, set pulse current transition times, or other functionality.

The power logic 620 interprets the control signal 606, and determines signals to provide to the circuits 625a, 625b, 625c by way of signal paths 621a, 621b, 621n to accomplish the function indicated by the control signal 606. For example, the power logic 620 may assert a logical "on" signal (which may be a logic high or a logic low) for one or more of the circuits 625a, 625b, 625c on respectively one or more of signal paths 621a, 621b, 621n, and assert a logical "off" signal for the others of the circuits 625a, 625b, 625c. For circuits turned on in this manner, an output is provided at outputs 626a, 626b, 626c.

Figure 6B:
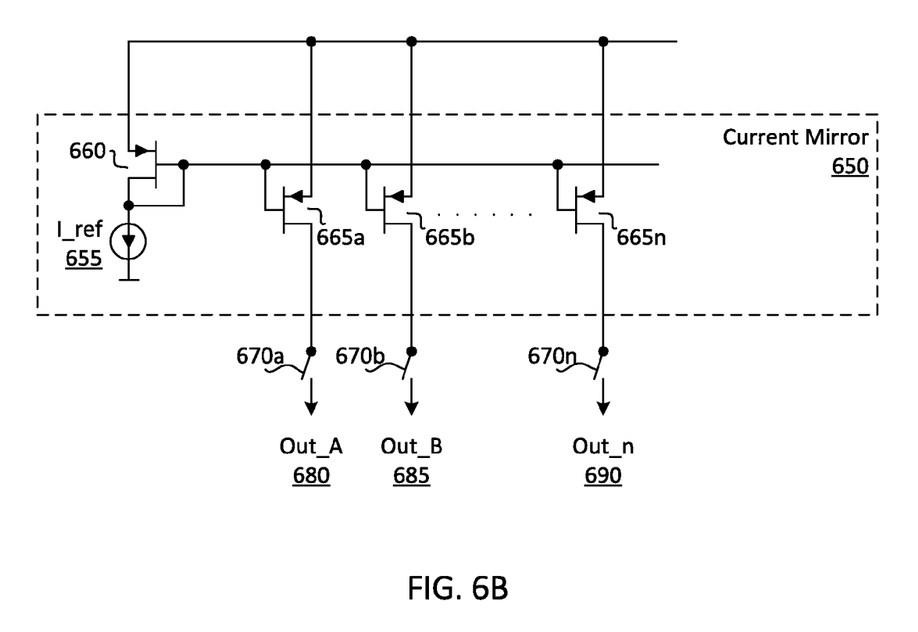
FIG. 6B illustrates an example of a system for controlling transition times of a current pulse according to one embodiment.

FIG. 6B illustrates an example of circuitry implementing circuits 625a, 625b, 625c in FIG. 6A according to an embodiment. In this embodiment, a current mirror 650 includes a reference current generator 655 and a reference transistor 660. The reference transistor 660 and mirror transistors 665a, 665b, 665n share a common gate voltage and a common source voltage. Each mirror transistor 665a, 665b, 665n can be activated by closing a respective switch 670a, 670b, 670n, and when activated, a current flows through respective outputs 680, 685, 690 (Out_A, Out_B, Out_n). A reference current I_ref generated by the reference current generator 655 and flowing through reference transistor 660 can be mirrored to activated ones of transistors 665a, 665b, 665n. Physical dimensions of each transistor 665a, 665b, 665n can be designed relative to respective dimensions of the reference transistor 660 to obtain a desired ratio of current through the transistor 665a, 665b, 665n relative to I_ref. Thus, for example, if the transistor 665a and the reference transistor 660 have the same design dimensions, then a current approximately equal to I_ref will flow through the transistor 665a when activated by switch 670a (i.e., Out_A≈I_ref). In one embodiment, the switches 670a, 670b, 670n may be controlled by signals such as signals 621a, 621b, 621c in FIG. 6A (e.g., circuit 625a in FIG. 6A may include transistor 665a and switch 670a in FIG. 6B).

Referring back to FIGS. 4A-4C, it may be desirable to limit transition times for rising and falling edges of current waveforms. In some embodiments, current is directly provided to power a receiving component (e.g., a sensor) and thus transition times for rising and falling edges of current waveforms can be directly controlled, while in other embodiments, voltage is provided to power the receiving component and transition times of the current are controlled by limiting current flow. In either case, the embodiment of FIG. 6A or the embodiment of FIG. 6B may be used to provide a controlled (or limited) amount of current. For example, with reference to FIG. 6B, all of the outputs 680, 685, 690 may be electrically connected to a common line, switch 670a may be activated to provide a first current on output 680 and the common line, switch 670b may then be activated to provide a second current on output 685 and to provide the first and second currents combined on the common line, and then switch 670n may be activated while switch 670b is deactivated to provide a third current on output 690 and the first and third currents combined on the common line. It is to be understood that this is just one example of many sequences and combinations that could be used to control or limit current flow.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical system (MEMS) device, comprising:
    a MEMS element;
    a sensor for detecting a parameter; and
    a power supply providing current to the sensor, the power supply arranged to control current during a ramp-up transition of the current and a ramp-down transition of the current, the control of the current during the ramp-up transition and the ramp-down transition attenuating high-frequency components of the provided current.

2. The MEMS device of claim 1, wherein the parameter is temperature.

3. The MEMS device of claim 1, wherein the parameter is one of humidity, pressure, presence of a gas, or concentration of a gas.

4. The MEMS device of claim 1, wherein the MEMS element comprises an acoustic device, and wherein the attenuation of the high-frequency components reduces one or both of thermal noise effects and electrical noise effects on acoustic information provided from the acoustic device.

5. The MEMS device of claim 1, wherein the power supply is further configured to provide power to the sensor between the ramp-up transition and the ramp-down transition sufficient to maintain the sensor in an ON state.

6. The MEMS device of claim 5, wherein the power supply is further configured to increase the current from a first current value to a second current value while the sensor is in the ON state.

7. The MEMS device of claim 5, wherein a duration of the ON state is between about 50 ms and 200 ms.

8. The MEMS device of claim 1, wherein the power supply is further configured to control current during the ramp-up transition according to a ramp-up current profile, and the power supply is further configured to control current during the ramp-down transition according to a ramp-down current profile.

9. The MEMS device of claim 8, wherein the ramp-up current profile and the ramp-down current profile are different from each other.

10. The MEMS device of claim 8, wherein one or both of the ramp-up current profile and the ramp-down current profile are one of linear, non-linear, logarithmic, or exponential.

11. A method of providing power from a power supply to a sensor positioned within a microelectromechanical system (MEMS) device, the method comprising:
    providing current from the power supply to the sensor according to a ramp-up profile, wherein the current from the power supply is controlled such that the ramp-up profile has attenuated high-frequency components;
    providing current from the power supply to the sensor according to a ramp-down profile, wherein the current from the power supply is controlled such that the ramp-down profile has attenuated high-frequency components; and
    providing power to the sensor between a ramp-up transition associated with the ramp-up profile and a ramp-down transition associated with the ramp-down profile sufficient to maintain the sensor in an ON state.

12. The method of claim 11, wherein the attenuation of the high-frequency components reduces thermal noise effects and electrical noise effects on acoustic information provided from an acoustic device of the MEMS device.

13. The method of claim 11, wherein a duration of the ON state is between about 50 ms and 200 ms.

14. The method of claim 11, further comprising increasing the current from a first current value to a second current value while the sensor is in the ON state.

15. The method of claim 11, wherein the method is repeated at predefined intervals corresponding to a sampling rate of the sensor.

16. A microelectromechanical systems (MEMS) device comprising:
    a housing having a sound port;
    an acoustic MEMS transducer disposed in the housing and acoustically coupled to the sound port;
    a non-acoustic sensor disposed in the housing; and
    an electrical circuit disposed in the housing and electrically coupled to the transducer, the sensor, and to an external interface of the housing;
    wherein the electrical circuit includes a power supply coupled to the sensor and configured to provide a current pulse to the sensor, the current pulse having a ramp-up portion, a power-delivery portion, and a ramp-down portion; and
    wherein profiles of the ramp-up portion and the ramp-down portion are configured to reduce acoustic artifacts at an output of the MEMS device.

17. The device of claim 16, wherein the ramp-up portion has a profile configured to reduce sharp corners between the ramp-up portion and the power-delivery portion, and wherein the ramp-down portion has a profile configured to reduce sharp corners between the power-delivery portion and the ramp-down portion.

18. The device of claim 16, wherein the ramp-up and the ramp-down portion are configured to attenuate frequency components that cause acoustic artifacts.

19. The device of claim 16, wherein a duration of the power-delivery portion is configured to produce harmonic frequencies outside of an audible range.

20. The device of claim 16, wherein the ramp-up portion and the ramp-down portion have a profile that is linear, non-linear, logarithmic, or exponential, and wherein the acoustic artifacts result from thermal noise or electrical noise.

* * * * *